United States Patent [19]

Kalnitsky et al.

[11] Patent Number: 4,859,303
[45] Date of Patent: Aug. 22, 1989

[54] METHOD AND APPARATUS FOR REMOVING COATING FROM SUBSTRATE

[75] Inventors: Alexander Kalnitsky, Ottawa; Joseph P. Ellul; Sing P. Tay, both of Nepean; Jacques G. Poirier, Kanata, all of Canada

[73] Assignee: Northern Telecom Limited, Montreal, Canada

[21] Appl. No.: 106,213

[22] Filed: Oct. 9, 1987

[51] Int. Cl.⁴ .............................................. C23F 1/02
[52] U.S. Cl. ............................ 204/192.36; 156/345; 156/643; 204/192.32; 204/298
[58] Field of Search ............... 204/192.32, 192.35, 204/192.36, 192.37, 298 EG, 298 EP, 298 MW; 156/345, 643, 646

[56] References Cited

U.S. PATENT DOCUMENTS

| | | | |
|---|---|---|---|
| 3,879,597 | 4/1975 | Bersin | 219/121 |
| 4,158,589 | 6/1979 | Keller et al. | 156/345 |
| 4,358,686 | 11/1982 | Kinoshita | 250/492.2 |
| 4,512,868 | 4/1985 | Fujimura et al. | 204/298 |
| 4,540,466 | 9/1985 | Nishizawa | 156/643 |
| 4,595,484 | 6/1986 | Giammarco et al. | 204/298 |
| 4,609,428 | 9/1986 | Fujimura | 156/643 |
| 4,631,105 | 12/1986 | Carroll et al. | 156/345 |
| 4,673,456 | 6/1987 | Spencer | 156/643 |
| 4,699,689 | 10/1987 | Bersin | 156/643 |
| 4,718,974 | 1/1988 | Minaee | 156/643 |
| 4,718,976 | 1/1988 | Fujimura | 156/643 |

Primary Examiner—John F. Niebling
Assistant Examiner—W. T. Leader
Attorney, Agent, or Firm—R. J. Austin; C. W. Junkin

[57] ABSTRACT

In a method and apparatus for plasma stripping a polymer photoresist coating from a semiconductor substrate, positively charged species are removed from an activated gas flow before the gas flow is brought into contact with the coating to strip the coating from the substrate. The positively charged species may be removed by bringing the activated gas into contact with a grounded conducting surface to discharge the positively charged species, or by passing the activated gas through a negatively charged electrostatic filter to filter out positively charged species. The removal of positively charged species from the gas flow reduces or eliminates build up of positive charge on an outer surface of the photoresist coating so as to avoid driving mobile positively charged ions from the photoresist into the substrate, thereby avoiding contamination of the substrate.

8 Claims, 4 Drawing Sheets

METHOD AND APPARATUS FOR REMOVING COATING FROM SUBSTRATE

The present invention relates to a method and apparatus for removing a layer of coated material from a substrate.

Layers of coating material, such as polymer photoresist, are commonly applied to substrates, such as semiconductor wafers, during the manufacture of semiconductor devices. It is known to remove such layers of coating material from the substrates by activating a gas and impinging the activated gas on the layer of coating material to break down the coating material and strip it from the substrate. The activated gas, for example oxygen, reacts chemically with the coating material to form gaseous products, thereby stripping the coating material from the substrate.

When such known techniques are used to remove polymer photoresist from substrates, accumulation of positively charged species of the activated gas at the outer surface of the polymer photoresist layer sets up an electric field which drives mobile positively charged ions (for example sodium, potassium or lithium ions) present in the polymer photoresist layer into the substrate, thereby contaminating the substrate.

The present invention seeks to provide a method and apparatus for removing a layer of coating material from a substrate which reduces positive ion contamination of the substrate.

According to one aspect of the present invention, there is provided a method for removing a layer of coating material from a substrate, comprising: activating a gas; removing positively charged species from the activated gas; and impinging the activated gas on a layer of coating material after removal of positively charged species from the activated gas to break down the coating material and strip it from a substrate.

According to another aspect of the invention, there is provided apparatus for removing a layer of coating material from a substrate, comprising: means for supporting a substrate in a support position; means for activating a gas; and means for removing positively charged species from the activated gas, said removing means being disposed between said activating means and said support position, having at least one opening to permit flow of activated gas from the activating means to the support position, and being operable to remove positively charged species from said flow of activated gas.

By removing positively charged ions from the activated gas before it is impinged on the coating material, the method and apparatus of the present invention avoid accumulation of positively charged species at the outer surface of the coating layer, thereby avoiding the creation of electric fields which would drive mobile positively charged ions into the substrate.

The positively charged species may be removed from the activated gas by bringing the activated gas into contact with a grounded surface to discharge ionized species in the activated gas. This may be done by passing the activated gas through a diffuser comprising electrically grounded conducting walls defining a chamber, one of the walls having at least one inlet aperture for permitting activated gas to flow into the chamber and another of the walls having at least one outlet aperture for permitting discharged activated gas to flow out of the chamber and onto the coating. Preferably, the inlet apertures and outlet apertures are arranged in offset patterns to induce turbulence in the activated gas as it flows through the chamber. The turbulence ensures adequate contact of the activated gas with the conducting walls of the chamber, and provides a relatively uniform flow of discharged activated gas onto the coating material.

Thus, according to yet another aspect of the present invention, there is provided a diffuser for discharging and diffusing an activated gas, comprising electrically conducting walls defining a chamber, one of said walls having at least one inlet aperture and another of said walls having at least one outlet aperture, said inlet and outlet apertures being arranged in offset positions, and means for mounting the diffuser within a reaction vessel.

Alternatively, positively charged species may be removed from the activated gas by bringing the activated gas into contact with a negatively charged surface which attracts and discharges the positively charged species.

Embodiments of the invention will now be described, by way of example only, with reference to the accompanying drawings, in which.

Figure 1:
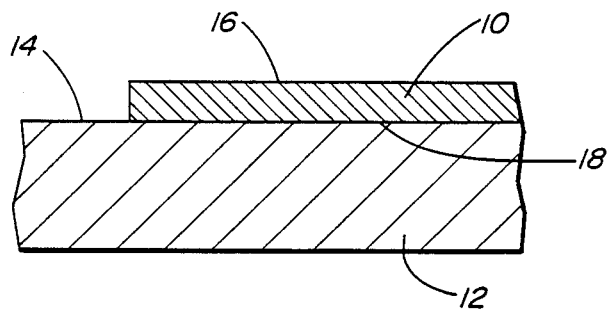
FIG. 1 is a cross-sectional view of a substrate carrying a layer of coating material.

Referring to FIG. 1, a layer 10 of coating material in the form of polymer photoresist is commonly applied to a substrate 12 in the form of a semiconductor wafer during the manufacture of semiconductor devices. The layer 10 may extend over all or part of a surface 14 of the substrate 12, and the substrate may include layers of oxide, nitride, metal or polycrystalline semiconductor material in addition to monocrystalline semiconductor material.

Figure 2:
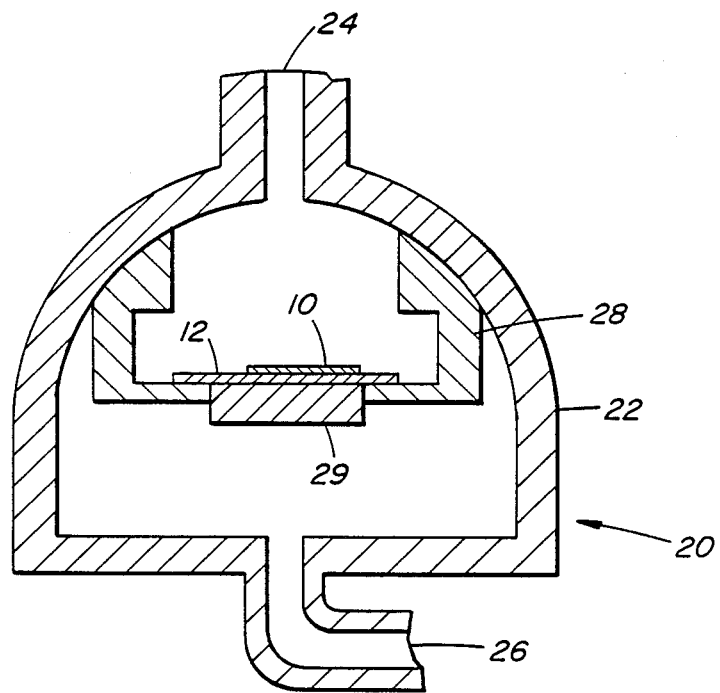
FIG. 2 is a cross-sectional view of part of a conventional plasma stripping apparatus.

It is frequently necessary to remove such a layer from such a substrate and for this purpose a known plasma stripping apparatus 20, shown in part in FIG. 2, is commonly used. The plasma stripping apparatus 20 comprises a reaction vessel 22 having an inlet 24 and an exhaust outlet 26. Within the vessel 22 a support 28 is provided for supporting the substrate 12 in a support position between the inlet 24 and the exhaust outlet 26. The support 28 is heated by means of a heater 29, in thermal contact with the support, so as to heat the substrate 12. The MTI DPR Afterglo machine, manufactured by Machine Technologies, Inc. of Parsipanny, New Jersey, is one such plasma stripping apparatus. (Afterglo is a trade mark of Machine Technologies, Inc.)

In use of the plasma stripping apparatus, the inlet 24 is connected to a plasma generation means (not shown)

which applies a microwave frequency electric field to a gas to generate a plasma of the gas. The resulting activated gas is drawn through the inlet 24 by means of a pressure differential and into the vessel 22 to impinge upon a coating layer 10 on a substrate 12 placed on the support 28 and heated by the heater 29. The gas may be a reactive gas, such as $O_2$, $CF_4$, $SF_6$ or a freon gas. Such gases, when activated, chemically react with polymer photoresist to break it down and form gaseous products. The gaseous products are drawn from the vessel 22 through the exhaust outlet 26.

In the above process, positively charged species of the activated gas tend to accumulate at an outer surface 16 (see FIG. 1) of the layer 10 of photoresist. The accumulated positively charged species apply an electric field across the layer 10 which drives mobile positively charged ions (such as Na, Li or K ions) commonly found in polymer photoresists through the interface 18 (see FIG. 1) between the photoresist and the underlying substrate, thereby contaminating the substrate. The contamination remains when the stripping operation has been completed. The contamination is particularly significant where the substrate 12 includes an oxide layer immediately below the photoresist, since such oxide layers are relatively receptive to the contaminants and have physical properties which are significantly altered by the presence of the contaminants.

Figure 3:
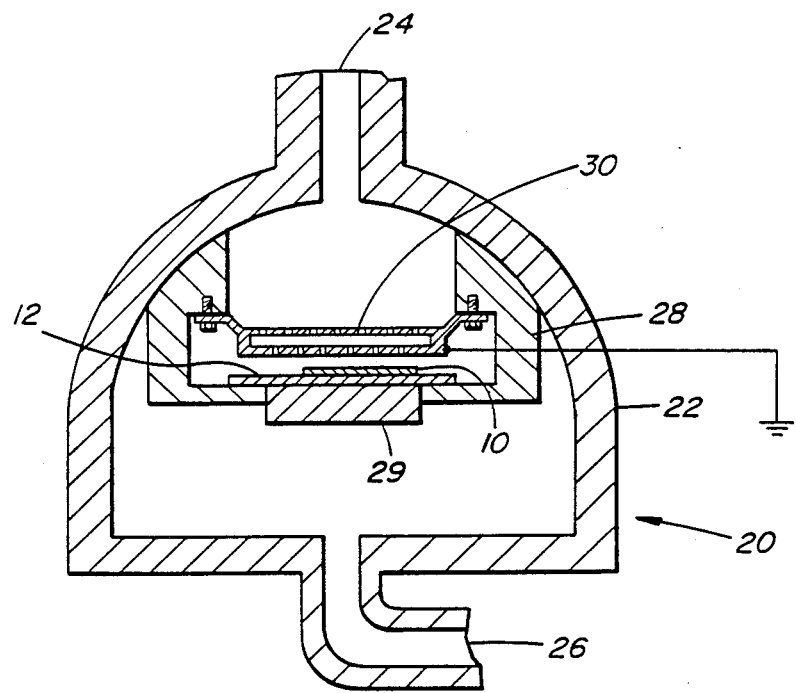
FIG. 3 is a cross-sectional view of part of a plasma stripping apparatus according to a first embodiment.

A plasma stripping apparatus, according to a first embodiment as shown in FIG. 3, inhibits the above problem. The apparatus is basically constructed in a manner similar to the apparatus of FIG. 2, and in the following description the same reference numerals will be used for such parts as were described with reference to FIG. 2. The first embodiment differs from the prior arrangement in that a diffuser 30 is mounted within the vessel 22 between the inlet 24 and the position in which the support 28 supports the substrate 12.

Figure 4:
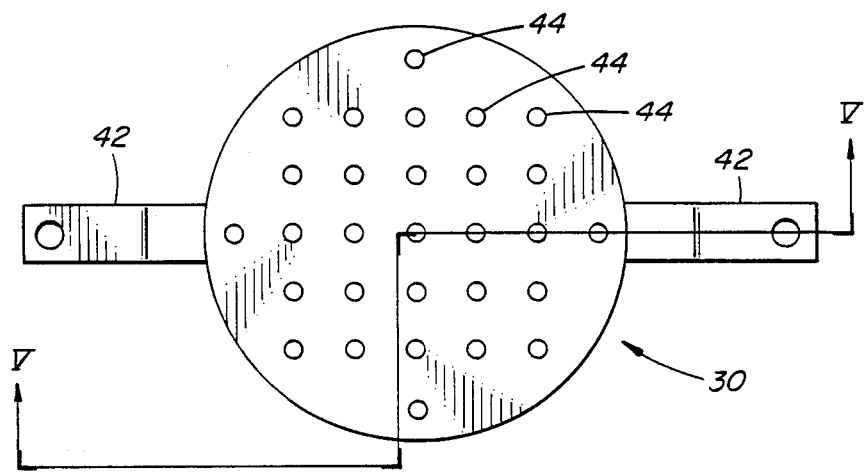
FIG. 4 is a plan view of a diffuser used in the first embodiment.
Figure 5:
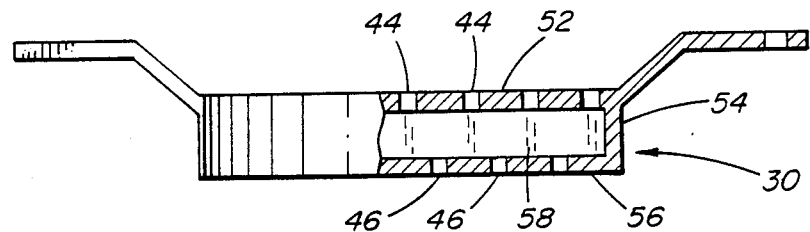
FIG. 5 is an elevational view, partly in cross-section, of the diffuser of FIG. 4, the section taken on section line V—V of FIG. 4.

The diffuser 30, shown in more detail in FIGS. 4 and 5, comprises electrically conducting walls 52, 54, 56 of aluminum defining a cylindrical chamber 58. The diffuser 30 is provided with a pair of arms 42 extending outwardly of the chamber 58 which act as means for mounting the diffuser in the vessel 22.

An uppermost wall 52 has several openings in the form of inlet apertures 44, and a lowermost wall 56 has several openings in the form of outlet apertures 46. The inlet apertures 44 are arranged in a first pattern, and the outlet apertures 46 are arranged in a second pattern offset from the first pattern so that there is no straight line path from the vessel inlet 24 through an inlet aperture 44 and an outlet aperture 46 and onto a substrate 12 mounted in the support position within the vessel 22.

In use of the apparatus of the first embodiment, the diffuser 20 is mounted in the vessel 22 and electrically connected to ground. The inlet 24 is connected to plasma generation means (not shown), and activated gas is drawn from the plasma generation means through the inlet 24 and onto the diffuser 30 by means of a pressure differential. The activated gas enters the chamber 58 via the inlet apertures 44. Because the outlet apertures 46 are not aligned with corresponding inlet apertures 44, turbulence is induced in the ionized gas, which is thereby brought into contact with the grounded electrically conductive surfaces of the diffuser 30. Such contact discharges charged species in the gas, to convert the charged species to activated uncharged gas atoms or molecules. Consequently, the diffuser provides means for removing positively charged species from the activated gas. The uncharged, activated atoms or molecules pass through the outlet apertures 46 and impinge upon the layer 10 of photoresist. As in conventional plasma stripping of photoresist, the activated gas atoms or molecules chemically react with the photoresist to form gaseous products, thereby stripping the photoresist from the substrate. Unlike conventional plasma stripping, however, there is little or no build up of positive charge on the exposed surface of the photoresist, so fewer mobile positively charged ions are driven from the photoresist into the underlying substrate. As a result, contamination of the substrate is reduced.

Figure 6:
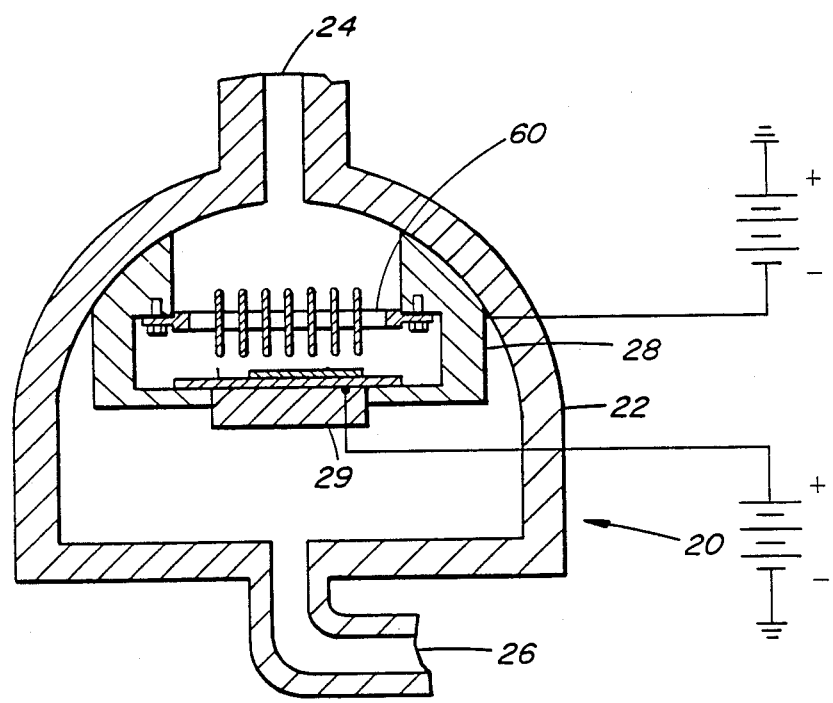
FIG. 6 is a cross-sectional view of part of a plasma stripping apparatus according to a second embodiment.

A plasma stripping apparatus according to a second embodiment as shown in FIG. 6, is constructed in a manner similar to the first embodiment, except that the diffuser 30 of the first embodiment is replaced with an electrostatic filter 60 mounted within the vessel 22 between the inlet 24 and the position in which the support 28 supports the substrate 12.

Figure 7:
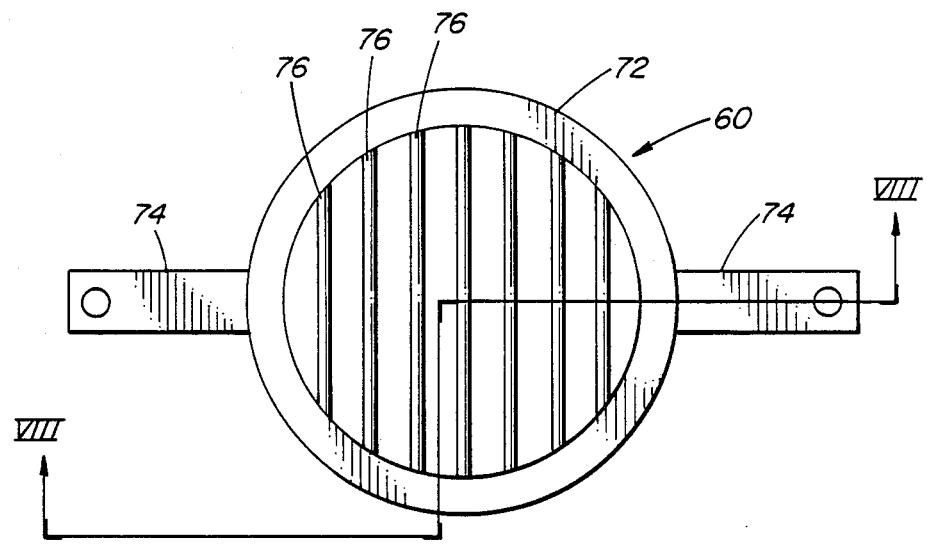
FIG. 7 is a plan view of a filter used in the second embodiment.
Figure 8:
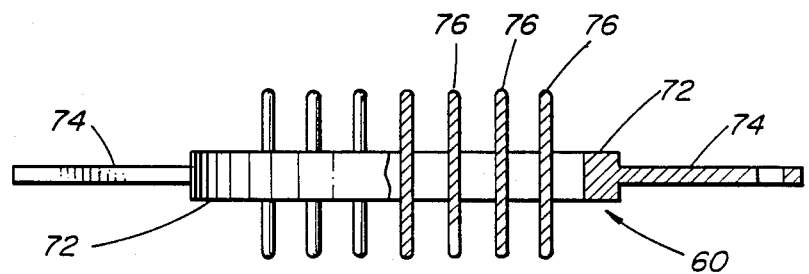
FIG. 8 is an elevational view, partly in cross-section, of the filter of FIG. 7, the section taken on section line VII—VII of FIG. 7.

The filter 60, shown in more detail in FIGS. 7 and 8, comprises an annular aluminum frame 72 provided with a pair of arms 74 extending outwardly of the frame. The arms 74 provide means for mounting the filter in the vessel 22. The filter also comprises a plurality of parallel aluminum plates 76 extending along chords of the annulus 72. The plates 76 are spaced apart to provide openings therebetween.

In use of the apparatus of the second embodiment, the filter 60 is mounted in the vessel 22 and provided with a negative electric charge. The inlet 24 is connected to plasma generation means (not shown), and activated gas is drawn from the plasma generation means through the inlet 24 and onto the filter 60 by means of a pressure differential. Positively charged species of the activated gas are attracted to the negatively charged surfaces of the plates 76 of the filter 60. Because positively charged species of the activated gas are removed by the filter 60, there is little or no build up of positive charge on the exposed surface of the photoresist, so there is a reduced tendency to drive mobile positively charged ions from the photoresist into the substrate. Consequently, contamination of the substrate is reduced. The substrate 12 may be provided with a positive charge to attract negatively charged species of the activated gas toward the substrate and to further discourage migration of positive ions from the photoresist to the substrate.

The diffuser 30 and filter 60 described above may be constructed of any suitable material so long as adequately conducting surfaces are provided. For example, metal, passivated metal or other materials coated with passivated conducting or semiconducting material may be used. Where metal is used, annealing following machining operations is advantageous to prevent cracking and eliminate inherent material faulting. The diffuser 30 may adopt any suitable shape which provides adequate surface contact with the activated gas for removal of positively charged species.

The reactive gas may be activated by methods other than application of microwave frequency electric fields. For example, the gas could be activated by exposure to ultraviolet light, although if this method is employed care should be taken to minimize exposure of the substrate to the ultraviolet light since the ultraviolet light may damage the surface of the substrate.

What is claimed is:

1. A method for removing a layer of coating material from a substrate, comprising:
   activating a gas;

inducing turbulence in the activated gas while discharging positive charged species in the activated gas by passing the activated gas through a diffuser comprising grounded electrically conducting walls defining a chamber, one of the walls having a plurality of inlet apertures for permitting activated gas to flow into the chamber, and another of the walls having a plurality of outlet apertures for permitting activated gas to flow out of the chamber, the inlet apertures being offset from the outlet apertures to induce the turbulence, the induced turbulence enhancing contact of the activated gas with the grounded walls to enhance discharge of positively charged species in the activated gas; and impinging the discharged activated gas on a layer of coating material to break down the coating material and strip it from a substrate.

2. A method as defined in claim 1, wherein the coating is polymer photoresist and the gas is selected from a group consisting of $O_2$, $CF_4$, $SF_6$ and freon gas.

3. A method as defined in claim 1, wherein the gas is activated by application of a microwave frequency electric field to generate a plasma.

4. A method as defined in claim 1, wherein the gas is activated by application of ultraviolet radiation.

5. A method as defined in claim 1, wherein the activated gas is drawn from the activating means to the support position by means of a pressure differential.

6. Apparatus for removing a layer of coating material from a substrate, comprising:

means for supporting a substrate in a support position;

means for activating a gas; and a discharging diffuser disposed between the activating means and the support position, the diffuser comprising grounded electrically conducting walls defining a chamber, one of the walls having a plurality of inlet apertures for permitting activated gas to flow into the chamber and contact the grounded conducting walls to discharge the activated gas, and another of the walls having a plurality of outlet apertures for permitting discharged activated gas to flow out of the chamber to the support position, the inlet apertures being offset from the outlet apertures to induce turbulence in the activated gas passing through the chamber and thereby enhance contact of the activated gas with the grounded walls.

7. Apparatus as defined in claim 6, wherein the means for activating a gas comprises means for applying a microwave frequency electric field to the gas to generate a plasma of the gas.

8. Apparatus as defined in claim 6, wherein the means for activating a gas comprises means for applying ultraviolet radiation to the gas.

* * * * *